United States Patent [19]
Akrout et al.

[11] Patent Number: 5,063,537
[45] Date of Patent: Nov. 5, 1991

[54] REPROGRAMMABLE LOGIC FUSE BASED ON A 6-DEVICE SRAM CELL FOR LOGIC ARRAYS

[75] Inventors: Chekib Akrout, Ris Orangis; Pierre Coppens, Savigny le Temple; Yves Gautier, Lesigny; Pierre-Yves Urena, Vence, all of France

[73] Assignee: International Business Machines Corporation, Armonk, N.Y.

[21] Appl. No.: 414,339

[22] Filed: Sep. 29, 1989

[30] Foreign Application Priority Data

Oct. 28, 1988 [EP] European Pat. Off. ............ 88480069

[51] Int. Cl.$^5$ ...................... G11C 7/00; G11C 11/412; G11C 17/16
[52] U.S. Cl. ...................................... 365/96; 365/154; 365/225.7; 365/189.08
[58] Field of Search ................... 365/96, 225.7, 189.08, 365/154, 189.05; 307/465, 468, 202.1, 465.1

[56] References Cited

U.S. PATENT DOCUMENTS

| | | | |
|---|---|---|---|
| 3,560,764 | 2/1971 | McDowell | 307/238 |
| 3,593,317 | 7/1971 | Fleisher | 340/172.5 |
| 4,177,452 | 12/1979 | Balasubramanian et al. | 340/166 P |
| 4,613,958 | 9/1986 | Culican et al. | 365/189.08 |
| 4,617,649 | 10/1986 | Kyomasu et al. | 365/104 X |
| 4,660,177 | 4/1987 | O'Connor | 365/154 |
| 4,694,425 | 9/1987 | Imel | 365/49 |
| 4,768,172 | 8/1988 | Sasaki | 365/154 X |
| 4,779,226 | 10/1988 | Haraszti | 365/49 |
| 4,791,603 | 12/1988 | Henry | 364/900 |
| 4,796,229 | 1/1989 | Greer, Jr. et al. | 365/189.08 |
| 4,845,676 | 7/1989 | Lohlein et al. | 365/189.05 X |
| 4,876,466 | 10/1989 | Kondou et al. | 307/465 |
| 4,887,239 | 12/1989 | Turner | 365/218 X |

OTHER PUBLICATIONS

IBM Technical Disclosure Bulletin, vol. 24, No. 5, Oct. 1981, "Reloadable Programmable Logic Array" by T. Winlow, pp. 2424–2425.
IBM Technical Disclosure Bulletin, vol. 26, No. 8, Jan. 1984, "Content Addressable Memory Cell Having Only Six Transistors" by A. G. Aipperspach et al., p. 4208.

*Primary Examiner*—Alyssa H. Bowler
*Attorney, Agent, or Firm*—Jeffrey L. Brandt; Richard A. Romanchik

[57] ABSTRACT

A reprogrammable logic fuse (RLF) based on a 6 device standard Static Random Access Memory (SRAM) cell includes a storage element comprised of four cross coupled FETs. A fifth FET is mounted in a transmission gate configuration between the bit line and a first common node of the storage element. Its gate electrode is connected to the word line. This FET is used to write the appropriate control data in the storage element for bit personality store. A sixth FET is also mounted in a transmission gate configuration between the second common node of the storage element and an output line. Its gate electrode is connected to the input line. This sixth FET ensures that a logical function, e.g. AND/-NAND is achieved between the signals available at the second common node and on the input line. Other configurations of said sixth FET are allowed. These reprogrammable logic fuses may be disposed in matrixes to constitute reloadable logic arrays and Reloadable PLAs (RPLAs). In the latter case, in the AND array the input and output lines are respectively the product term lines (if bit partitioning is employed) and AND term lines (or Match Lines). In the OR array, the input and output lines are respectively the Match Out lines (the signal on the Match Line after complementation) and the OR out lines. RPLAs employing these RLF's can be dynamically reprogrammed to allow in system logical reconfiguration in real time.

10 Claims, 5 Drawing Sheets

REPROGRAMMABLE LOGIC FUSE BASED ON A 6-DEVICE SRAM CELL FOR LOGIC ARRAYS

The present invention relates to Logic Arrays (LA's) and more particularly to a Reprogrammable Logic Fuse (RLF) based on a 6-device Static Random Access Memory (SRAM) cell which efficiently combines cell addressing means, bit personality storing means and logical function means at each input line/output line intersection of a logic array. In addition to its outstanding compactness due to the very small number of components used, the cell can be easily and dynamically reprogrammed by software to allow in-system logical reconfiguration in real time wherever desired by the user.

BACKGROUND OF THE INVENTION

Although the present invention applies to any semiconductor Integrated Circuit logic arrays, it is particularly effective when applied to Programmable Logic Arrays (PLA's), which basically are comprised of two elementary interconnected AND and OR logic arrays.

An outline of a PLA will first be given briefly. Generally speaking, a PLA is a logic circuit which receives a plurality of digital input signals and generates a plurality of digital output signals wherein each of the output signals is a programmable sum-of-product combination of the input signals.

As schematically shown in FIG. 1, a typical PLA circuit referenced 10 consists in the combination of a logical product array or AND array 11 and a logical summation array or OR array 12. The first array is designed for generating a plurality of terms which are the logical AND of the selected input signals, and the second array is designed to generate the output signals by selectively ORing the AND terms.

In the typical PLA circuit shown in FIG. 1, the AND array 11 receives a total of m digital input signals (data bits) X1 to Xm available on PLA circuit input line bundle 13 and generates a total of n AND terms (also called MIN terms) Y1 to Yn from the input signals, on AND term line bundle 14. The AND term lines are the AND array output lines. In turn, said n AND terms are applied to the OR array 12 as input signals to generate a total of k OR terms. In the schematic circuit of FIG. 1, no distinction can be made between AND array output lines and the OR array input lines, to carry signals Y1 to Yn from the AND array to the OR array. OR array output signals are obtained by selectively ORing the n AND terms. These OR array output signals P1 to Pk, are available on OR array output line bundle 15.

Each AND term is the AND combination of data, inverted data or don't care (don't care is formed by ignoring data or inverted data for a given AND input term).

Logical output signals satisfying predetermined logic conditions can thus be obtained from the PLA. In this instance, the logic conditions can be set as required in advance by the wiring of the internal circuit connections of each of the AND and OR arrays. In others words, they can be programmed.

In the design of modern computerized systems, a PLA may also be understood as offering ASSOCIATIVE capabilities. Still referring to FIG. 1, an input word (X1-Xm) is compared, in parallel to the words stored in the AND array 11.

If the input word is identical to one of the words stored in the AND array, it is said that a MATCH occurred, and the corresponding AND term line now termed "Match Line," is activated.

The Match Line activation allows the word stored on the corresponding line in the OR array to appear on the OR array output lines as the output word (P1-Pk). If no match occurs in the AND array, the output is zero. To really perform logic functions, a "don't care" capability must be added in the AND array. This means that the words stored in the AND array can be made of ones, zeroes, or don't cares. The comparison is performed without considering the bits in which a "don't care" has been stored. Assuming input signals X1 and X2 are compared to the content L1 and L2 of corresponding latches 20A and 20B, the following data should be stored in a given AND term line according to the value of A1 for the corresponding AND term:

| | | |
|---|---|---|
| A1 = 1 | L1 = 1 | L2 = 0 |
| A1 = 0 | L1 = 0 | L2 = 1 |
| A1 = "don't care" | L1 = 1 | L2 = 1 |

A given stored word can thus compare to any part of the input word. With the don't care state added, more than one word in the AND array can match the input word (or part of it), thus activating more than one line. In that case, it is said that a MULTIPLE MATCH occurred. The multiple match condition results in having to drive several words to the output of the OR array. In that case, the output word is made of the OR function of the words selected in the OR array.

With this approach, the PLA circuit 10 can thus be considered as a word generator, the output word content (P1-Pk), being driven by the input word content (X1-Xm). This gives the combinatorial logic capability. Storing the output word and using part of an output register to feed back part of the input word, gives the sequential logic capability.

As a fact, for many years, PLA's have been typically designed for use in electronic systems or computers requiring permanent non volatile logic arrays. Programmable Read Only Memories (PROM's) have been frequently used in that respect to physically implement Logic Arrays. Unfortunately, these PROM's can only be programmed once (no change in the program) can be made after personalization). A typical physical implementation of logic arrays was to use at each intersection of an input line and an output line (Match line for the AND array), the combination of a physical fuse and a diode for AND/OR operation. The fuse operates like a switch. Depending on its integrity, it is equivalent to say, the switch is closed or opened, in other words, the bit personality stored therein is either zero or one. Fuses are known to be a source of contamination and of potential failures in terms of reliability. If the diodes are so mounted that an OR operation is performed in the AND array, each output is complemented in an inverter to ensure the AND array output signal on the Match Line is effectively an AND term, according to De Morgan's rules: $\overline{A+B} = \overline{A} \cdot \overline{B}$ and $\overline{A \cdot B} + \overline{A} + \overline{B}$.

As a result, an inverter block may be optionally used and is represented by reference 16 in FIG. 1. On the other hand, the OR array output signals P1 to Pk need to be latched in sense amplifier/latch circuits before being used in external circuitry. The output sense amplifier/latch block is referenced 17 in FIG. 1. At the output of block 17, OUT signals O1 to Ok are available on OUT line bundle 15a.

The PLA circuit 10 shown in FIG. 1 is of the type described above, say with a "fixed" content, like in a Read Only Store (ROS).

A "variable" content can be obtained with EPROM's (Erasable PROM's) or EEPROM's (Electrically Erasable PROM's), but these circuits exhibit specific inconveniences, e.g. they require special power supplies/voltage swings, e.g. 15-30 volts, and tools. In addition, they are costly components.

Another significant improvement to allow Read/Write logic was to associate a storage element (to latch either a one or a zero) and an AND gate at each intersection as disclosed in U.S. Pat. No. 3,593,317 assigned to IBM Corporation. As taught in this patent, the storage element is a two state latch which is part of a register. As a result, this combination has the same effect as the switch and diode combination mentioned above, except in that, potential reconfiguration of the logic conditions is then allowed, which in turn, adds the flexibility highly desired by the user. However, this is implemented of course at the cost of extra circuitry.

On the other hand, in designing a PLA, it is essential to constitute logical functions by using a minimal silicon area. A conventional means for decreasing the number of AND term lines in the AND array of the PLA includes a system of partitioning inputs. For example, a method which employs a two input-four output decoder (also referred to as a product term generator) for partitioning inputs, is described in U.S. Pat. No. 3,593,317 cited above. FIG. 1 shows such a product term generator referenced 18. IN signals A1 to Ap are applied to the generator through IN line bundle 13a. The decoded signals are signals X1 to Xm to be used as the input signals for the AND array 11, such as e.g.: $X1=\overline{A1}.\overline{A2}$, $XZ=\overline{A1}.A2$, $X3=A1.\overline{A2}$ and $X4=A1.A2$, the latch content must be "one" for any "don't care" condition.

FIG. 2 shows a portion of a typical AND array, referenced 11', using the combination of a storage element (e.g. a latch) and an AND gate in a logic array circuit wherein the above mentioned technique of partitioning is employed. The disclosed implementation is given in the associative environment as explained above.

As apparent from FIG. 2, a digital IN word W comprised of 6 bits A1 to A6, feeds bit partitioning logic circuitry comprised of three 2 bit decoders grouped in a decoder block 18 which decodes the one out of four possible states of the two bit input (00, 01, 10, 11). Decoder 18 may also be designated as a product term generator. Thus, there are 4 product term lines per 2 bits of word W. These product term (input) lines are the AND array input lines and they run through the AND array, in the vertical direction, downward, to supply decoded digital input signals X1 to X12 to the whole AND array 11'. The four first product term lines connected to product term generator 18 form line bundle 19. For example, product term line 19A carries input signal $X1=A1.\overline{A2}$ supplied by product term generator 18. The input word W' for the AND array is therefore comprised of 12 bits (X1 to X12). To each row and each product term line such as 19A, is associated the combination of a latch and an AND gate respectively referenced 20A and 21A. Depending on the binary content of the latch, the AND gate enables or not passing further the product term signal. The manner in which the bit personality is secured in the latch is not detailed, because it is considered to be normal practice to those skilled in the art to set the control data. As disclosed in U.S. Pat. No. 3,593,317, the latch is part of a shift register. This combination referenced 22A plays the same role as a controllable electronic logic fuse.

For the 4 product term lines 19A to 19D supplied by product term generator 18, the respective outputs of the AND gates 21A to 21D are applied via line bundle 23, to a 4 input OR gate 24A. Similar construction applies to other product term lines handling the remaining input bits, so that two additional OR gates 24B and 24C are necessary. The outputs of OR gates 24A to 24C are fed into a 3 input AND gate 25. AND term signal or match signal is available to output of AND gate 25 on a Match Line referenced ML1. As a fact, every six inputs, a logic block 26 comprised of three 4 input OR gates and one 3 input AND gate, has to be implemented. The usage of these AND and OR gates having a limited number of inputs is made necessary due to limitations caused by the technology.

Without these material limitations, AND gate 25 would be extended to a number of inputs corresponding to the number of OR circuits 24A . . .

Irrespective of logic block 26, the PLA circuit of FIG. 2 may be seen as a logic array including a matrix of conductors comprised of input lines (e.g. 19A) and output lines (e.g. ML1) running orthogonally, thereby defining imaginary intersections or cross-points therebetween, electrically isolated from each other, each intersection being provided with an electronic logic fuse (ELF).

At last, similar construction applies to the n rows of the AND array.

Instead of being implemented with a latch of a shift register, the storage element (e.g. 20A) of the combination forming the so called electronic logic fuse, can be a Random Access Memory cell of either the Dynamic or Static type.

Usage of a Dynamic Random Access Memory (DRAM) cell is described, in the IBM Technical Disclosure Bulletin, Vol. 24, No. 5, October 1981, pp 2,424-2,425 in an article entitled: Reloadable PLA's by T. Winlow. In this article, there is described an AND array configuration in MOSFET technology which includes: a plurality of word lines (9) disposed horizontally and a plurality of bit lines (8) disposed vertically. Physically, said word lines and bit lines are conductors which form a first matrix of a first type of non conductive intersections. The AND array further includes: a plurality of input lines (2) disposed vertically and a plurality of output lines (3) disposed horizontally. Physically, said input lines and output lines are conductors which form a second matrix of a second type of non conductive intersections. For each couple of such electrically isolated intersections, there is an electronic logic fuse (5). To achieve it, an additional control FET device (94) is connected in series with the MOSFET switching device (1) to form the AND gate. The binary state of a one device DRAM cell comprised of a memory FET (6) and a storage capacitor (7) enables or disables said AND gate. Accordingly, depending on the content of the DRAM cell, the AND array may be reconfigured by the user wherever desired thanks to its Read/Write capabilities. This solution, although of interest because it does not use much silicon area, is known to be relatively slow and further, needs extra refresh circuitry. Refresh logic circuits need to be coupled to the cell bit lines for periodically restoring the charge on the storage capacitors, making more complex any solution implementing DRAM cells.

On the other hand, the electronic logic fuses, e.g. 22A of AND array 11' shown in FIG. 2, could be implemented in MOSFET technology with Static RAM (SRAM) cells, as well.

FIG. 3 details a portion of the AND array 11' of FIG. 2 when reconfigured with a standard 6 device SRAM cell in CMOSFET technology. Broadly, array 11' has the same organization that the AND array disclosed in the Technical Disclosure Bulletin article cited above, same Read/Write capabilities, however, each electronic logic fuse is now differently implemented. The electronic logic fuse now referenced 22'A first includes a read/write memory cell 20'A comprised of first and second pairs of cross coupled transistors for latch operation. The first pair includes two PFETs T0 and T1, and the second pair includes two NFETs T2 and T3. The source electrodes of FETs T0 and T1 are connected to the high voltage of a first power supply and the source electrodes of FETs T2 and T3 are connected to the low voltage of a second power supply. In the present embodiment only one power supply is sufficient, memory cell 20'A is biased between a high voltage (VH) and a low voltage (GND). The outputs of he memory cell available at common nodes A and B are connected to a pair of complementary bit lines referenced BL1 and $\overline{BL1}$ through two NFETs mounted in a transmission or transfer gate configuration which are respectively referenced T4 and T5. The gate electrodes of the latter FETs are connected to the corresponding word line WL1. The NAND gate 21'A is typically comprised of four FETs mounted in series. PFETs T6 and T7, and NFETs T8 and T9 perform the NAND function. The gate electrodes of FETs T7 and T8 are connected to one common node, e.g. B, of the memory cell and gate electrodes of FET T6 and T9 are connected to the product term line PT1 also referenced 19A. The output signal of NAND gate 21'A is available at node C on line 23A. All the word lines (e.g. WL1) are connected to a word line decoder/driver block 27 and the bit lines (e.g. BL1) are connected to a bit line write driver block 28.

When provided with such Read/Write capabilities by using a typical SRAM cell as the storage element, as shown in FIG. 3, a PLA with "variable" content may be schematically represented by PLA circuit 10' shown in FIG. 4. Inverter block 16', sense amplifier/latch block 17' and decoder block 18' are quite similar to corresponding blocks of FIG. 1. The main distinction comes from new circuitry necessary to perform above mentioned Read/Write capabilities. AND array 11' is provided with word decoder block 27 which drives the word lines such as WL1 and bit line write driver block 28 which drives the bit lines such as BL1. Similar construction applies to the OR array 12', which is provided with a word decoder block 29 and a bit line write driver block 30. It is to be noted that depending on the technology used (MOSFET, CMOSFET, ...) the signals on the Match Lines, e.g. ML1 may need to appear complemented at the output of inverter block 16' on the Match Out Lines, e.g. ML'1.

When implemented with either a one device DRAM cell or a 6 device SRAM cell, the electronic logic fuse 22A can be referred to as a reprogrammable logic fuse (RLF) because its binary content may be changed at will by the user.

If the first row of the AND array 11' is implemented with the reprogrammable logic fuse 22'A of FIG. 3, the count of elementary devices is:
a) as to the electronic fuses (22'A, ...)
 (1) 12 R/W latches (6 devices each)
 (2) 12 AND gates (4 devices each)
b) as to the logic block 26
 (1) 3 4-input OR gates (8 devices each)
 (2) 1 3-input AND gate (6 devices each).

As a result, 150 FET devices are therefore necessary to implement only one row of the embodiment shown in FIG. 2. The above approach exhibits obvious inconveniences in terms of density, wiring lengths and propagation delays. In particular, propagation delays result of the three layer logic structure of the embodiment shown in FIG. 2. The first layer consists of the AND gates (e.g. 21A) fed by the product terms lines (e.g. 19A), the two other layers respectively consist of the OR gates (e.g. 24A) and the AND gate (25), the latter gate feeds the Match Line ML1. These OR gates and AND gate which form the above mentioned logic block 26 are a penalty in terms of delay and density. The penalty increases as the number of product terms increases, due to technology limitations in the AND gate 25 mentioned above.

SUMMARY OF THE INVENTION

The foregoing illustrates limitations that are known to exist in present Read/Write logic array implementations. Thus, it is apparent that it would be advantageous to provide an alternative directed to overcoming one or more of the limitations set forth above and this is a main objective of the present invention.

Therefore, it is a primary object of the present invention to provide a new design of a reprogrammable logic fuse in CMOSFET technology leading to a physical implementation of logic arrays which requires less semiconductor chip area and significantly reduces delays to improve overall circuit performances.

It is another object of the present invention to provide a new design of a reprogrammable logic fuse to be used in logic arrays which has intrinsic logic function capabilities to avoid the use of supplementary logic circuitry within the logic array.

It is still another object of the present invention to provide a new design of a reprogrammable logic fuse to be used in logic arrays which is fully compatible with standard RAM requirements in terms of power supplies and voltage swings to avoid the need for high reprogramming voltages or specific tools.

It is still a further object of the present invention to provide a new design of a reprogrammable logic fuse which can be extensively used in the construction of high density PLA like circuits.

The above objects are accomplished by providing a reprogrammable logic fuse (RLF) based on a 6 device SRAM cell structure similar to that currently used in the standard SRAM design. In a known manner, four devices of the cell are appropriately connected to form the storage element to store the control data for bit personality. One fifth device is used to address the storage element and write the control data in it. This device is mounted in a transmission gate configuration between a bit line and a first common node of the storage element. Its gate electrode is connected to a word line. The sixth and last device facilitates the aforementioned logic function capabilities of the arrays. This latter device is mounted either in a transmission gate or in a switch configuration. In the transmission gate configuration it is mounted between the second common node of the storage element and a control line, which, in this case is the input line. Its gate electrode is connected to the input line. When connected in a PLA circuit, this 6 device SRAM cell performs the AND or the OR function (depending on which array is concerned), simply by applying input signals of appropriate polarity as it is well known from De Morgan's basic rules. The cell can be software personalized as a standard SRAM cell.

This construction allows the cell to be easily reconfigured with software by the user to allow high flexibility in the change of logic conditions. The present invention gives to the user the capability of making engineering changes on VLSI chips in the field, without any change at card or subassembly level. It also gives to the VLSI designer patch capabilities to the VLSI design. Because it requires a very limited number of devices, implementing such reprogrammable logic fuses in logic arrays, provides in turn, programmable high density or reloadable LA's or PLA's. Hence forth, an engineering change does not require a hardware change (in the wiring), but just a piece of software code to be loaded in the PLA chip macro.

BRIEF DESCRIPTION OF THE DRAWINGS

The foregoing and other aspects will become apparent from the following detailed description of the invention when considered in conjunction with the accompanying drawings.

In the drawings:

FIG. 7.

DETAILED DESCRIPTION OF THE INVENTION

Figure 5:
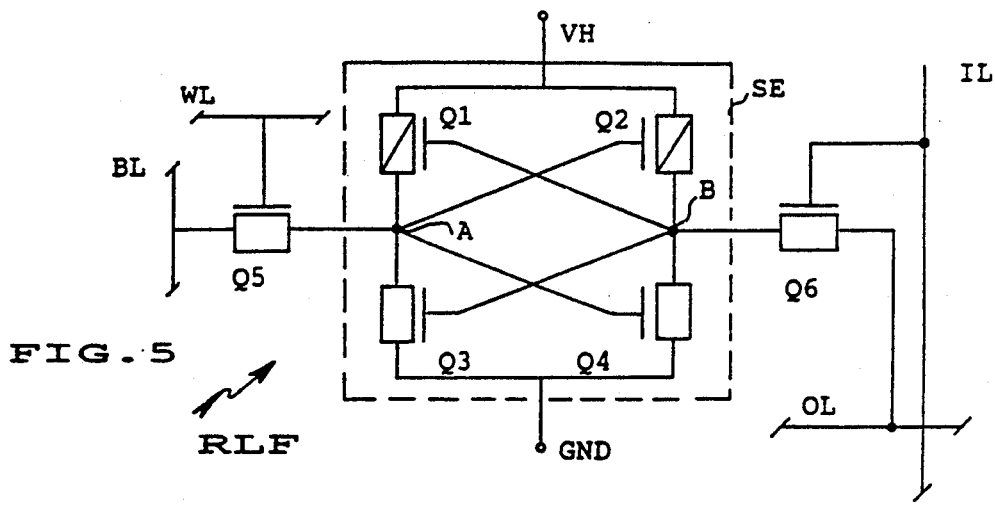
FIG. 5 shows a reprogrammable logic fuse (RLF) based on a 6 device SRAM cell to be used as an improved electronic logic fuse in logic arrays according to the teachings of the present invention.

FIG. 5 shows the details of a reprogrammable logic fuse RLF of the present invention. Such a RLF can be disposed at each intersection (bit line/word line and input line/output line) of a logic array as explained above. It is based on a 6 device standard SRAM cell in CMOSFET technology. However, the RLF of the present invention is not limited to that particular technology.

A latch comprised of four cross-coupled devices Q1 to Q4, constitutes the storage element SE of the RLF. In CMOS technology, the storage element SE is comprised of two active PFETs Q1 and Q2 and two active NFETs Q3 and Q4. A fifth device NFET Q5 is mounted in a transmission or transfer gate configuration, having its gate electrode connected to a word line WL which carries the word line signal and its source region to a bit line BL which carries the bit line signal. Its drain region is connected to a first common node A of the latch. NFET Q5 alone selects the appropriate storage element SE when multiple RLFs are arranged in a logic array, and writes in the desired control data to ensure that proper bit personality is secured therein.

Unlike the common usage of the 6 device standard SRAM cell where the addressing/writing means are comprised of two devices (T4 and T5 in FIG. 3), in the present implementation, addressing/writing means is limited to a single device (Q5). The sixth device Q6 so made free, is associated to the match line OL precharged to a positive voltage, and plays a determinant role in providing either the AND function in an AND array or the OR function in the OR array in the present implementation according to De Morgan's rules as explained above.

In the described embodiment of FIG. 5, device Q6 is a NFET mounted in a transmission or transfer gate configuration. The gate electrode of NFET Q6 is connected to a control line, (in this case the input line IL which carries the input signal), its drain electrode is connected to the output line OL which carries the output signal, and its source electrode is connected to the second common node B of the latch. In this configuration, a MISMATCH between the input signal on line IL and the signal present at node B (which is representative of the control data stored in SE), is detected for a complete line of cells (e.g. RLF11 to RLF1m as described on FIG. 7) using the combination of match line ML1 precharged at a positive voltage and the operation of transmission gates (e.g. Q6) having their drain electrodes connected to match line ML1. The match/mis-match detection will later be described in more detail. Bit line BL and Word Line WL on the one hand, input line IL and output line OL on the other hand define a couple of isolated (non conductive) intersections or cross-points.

It is the key role of NFET Q6 to couple the control data stored in SE and the digital signal available on the input line IL to ensure the desired MATCH detection on the output line OL.

Depending on the technology and the configuration used, some constraints may exist on the voltage swings to be applied to both input and/or output lines to ensure proper operation. This point will be discussed later.

As far as NFET Q6 is concerned, different configurations and types of conductivity of the latter are allowed, as shown in FIG. 6. Device Q6 may be either a PFET still mounted in a transmission gate configuration (FIG.

Figures 6A, 6B, 6C:
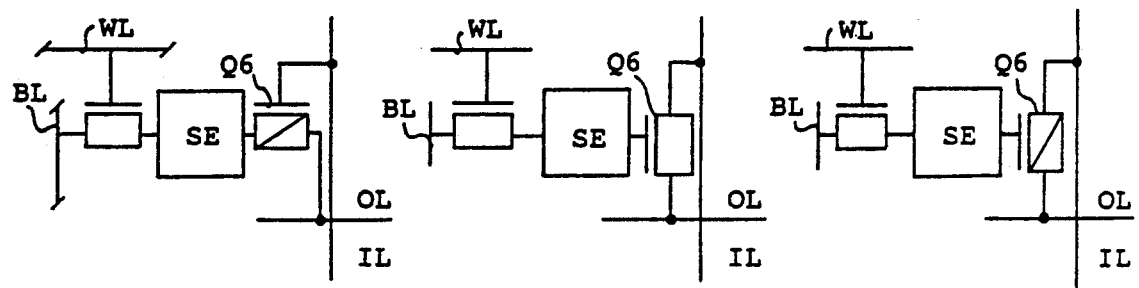
FIGS. 6(a)-6(c) show different ways of implementing the reprogrammable logic fuse of FIG. 5.

6A), or either a NFET or a PFET mounted in a switch configuration (FIGS. 6B & 6C).

Figure 7:
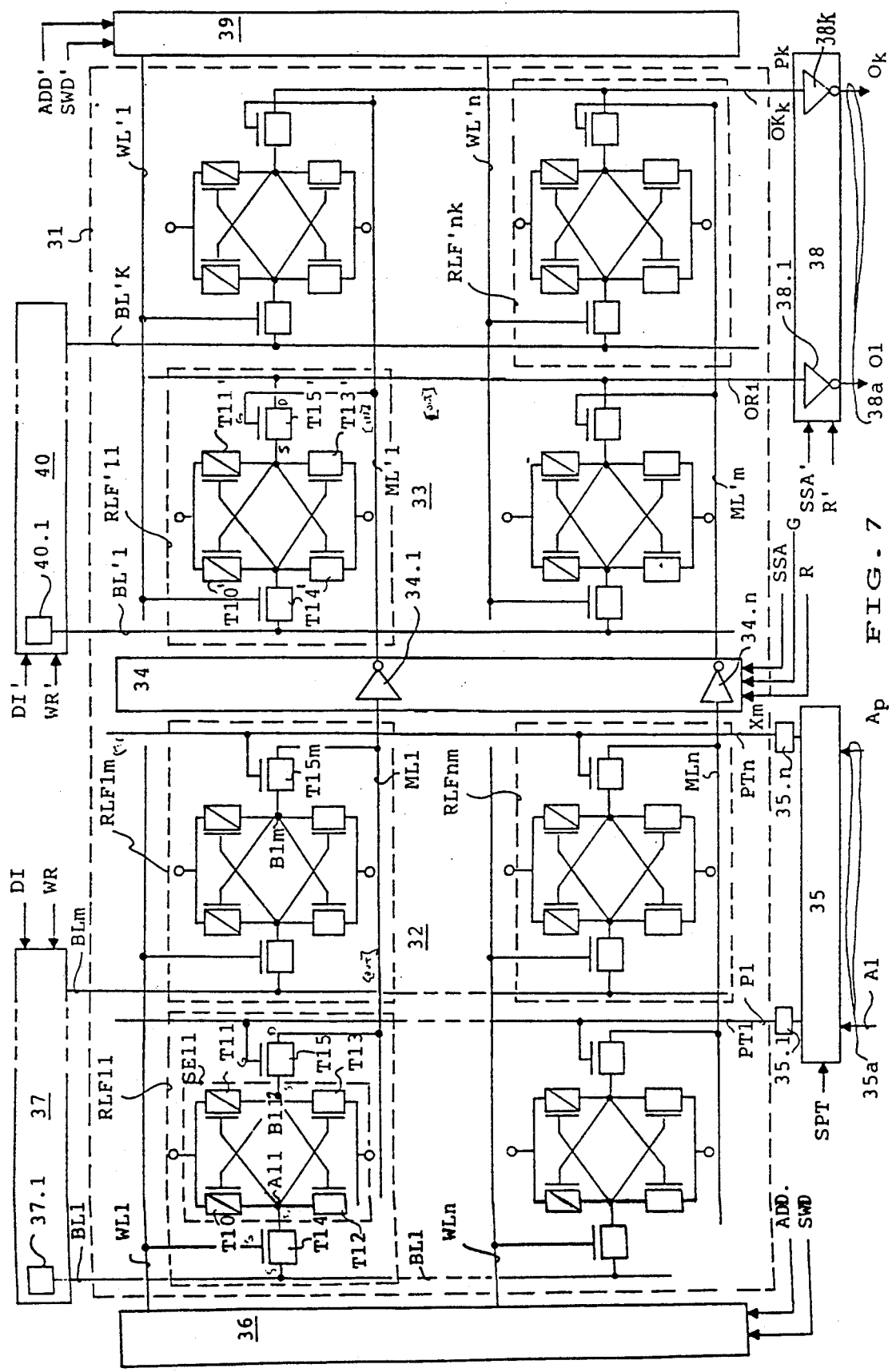
FIG. 7 shows the schematic diagram of a Reloadable PLA (RPLA) circuit when implemented with the reprogrammable logic fuse of FIG. 5, still according to the teachings of the present invention.

FIG. 7 shows the schematic diagram of a typical implementation of a Reloadable PLA (RPLA) circuit referenced 31, when the reprogrammable logic fuse (RLF) of the present invention is connected at each input line/output line intersection. RPLA 31 essentially consists of two elementary logic arrays: an AND array 32 and an OR array 33 and optionally of a series of circuits each including a sense amplifier contained in a block referenced 34. A decoder or product term (input) generator 35 receives the IN signals A1 to Ap on the IN lines. In turn, decoder 35 generates the decoded product terms X1 to Xm on individual product term lines PT1 to PTm. For example, in the case of portioned inputs, product term signal $X1=A1 \cdot A2$. is generated on product term line PT1. In practice, this is done by raising PT 1 to a positive voltage (the three other non active lines remain at 0V). In the AND array 32, there is a RLF at each intersection of a product term line and a match line. As a result, RLFs are arranged in a matrix configuration. The RLF at the (non conductive) intersection of the first row and first column of the AND array 32 in referenced RLF11. As explained above, RLF11 comprises six MOSFETs. The storage element SE11 is a standard memory cell comprised of four cross coupled FETs: T10 to T13. First and second common nodes of SE11 are referenced A11 and B11. NFET T14 permits the writing of control data in the storage element to ensure proper bit personality.

The 6th device is NFET T15. The gate electrode of NFET T15 is connected to the product term line PT1 and its drain electrode to the match line ML1.

Writing a control data in the storage element SE11 is done as usual. Word line WL1 is raised high (to VH) to ensure that transfer gate NFET T14 is conductive, and the appropriate binary data, e.g. a one, is latched by raising bit line BL1 to VH. It is said that a "one" is stored in SE11 when a positive voltage, e.g. VH, appears on the right side of the storage element SE11, say at the second common node B11. Writing in the storage elements of the matrix in the AND array implies standard extra circuitry: a logic block 36 which includes all the word line driver and decode circuitry and a logic block 37 which contains all the bit line write driver circuitry.

Product Term lines referenced PT1 to PTm are also referenced AND input lines, while product term signals referenced X1 to Xm are also referenced AND input signals (AND in 1, ... AND in m). The Match Lines referenced ML1 to MLn are also termed the AND output lines while the AND terms 1 to n are also referenced AND output signals (AND out 1, ... AND out n).

The MATCH detection operation will be described using the specific embodiment of FIG. 7. It can be recalled that a selected product term line (such as PT1) is at a positive voltage and an unselected product term line at 0 volt. It is said that a "1" is stored in SE cells when node N is at a positive voltage. The Match Lines ML are precharged at a positive voltage at the beginning of cycle. The transfer gate T15 conduction occurs when their gate electrodes (connected to the product term lines PT) are positive with respect to their source electrode (connected to node B of sells SE). The transfer gate T15 conduction will thus occur only when a "0" (0 volt on node B) is stored in a cell SE corresponding to a product term line PT at a positive voltage. This corresponds to MISMATCH condition on the given decoded input line. The transfer gate (e.g. T15) conduction causes, the initial positive precharged voltage of ML1 to be discharged to ground through T15, node B, and transistor T13 of cell SE11 (the T15 drain electrode being connected to Match Line ML1).

Figure 1:
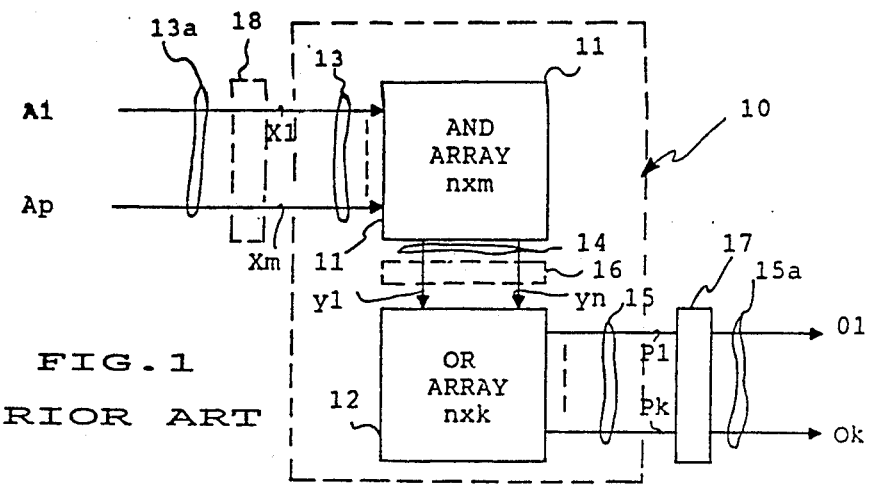
FIG. 1 is the schematic block diagram of a "fixed" content PLA of the prior art.
Figure 2:
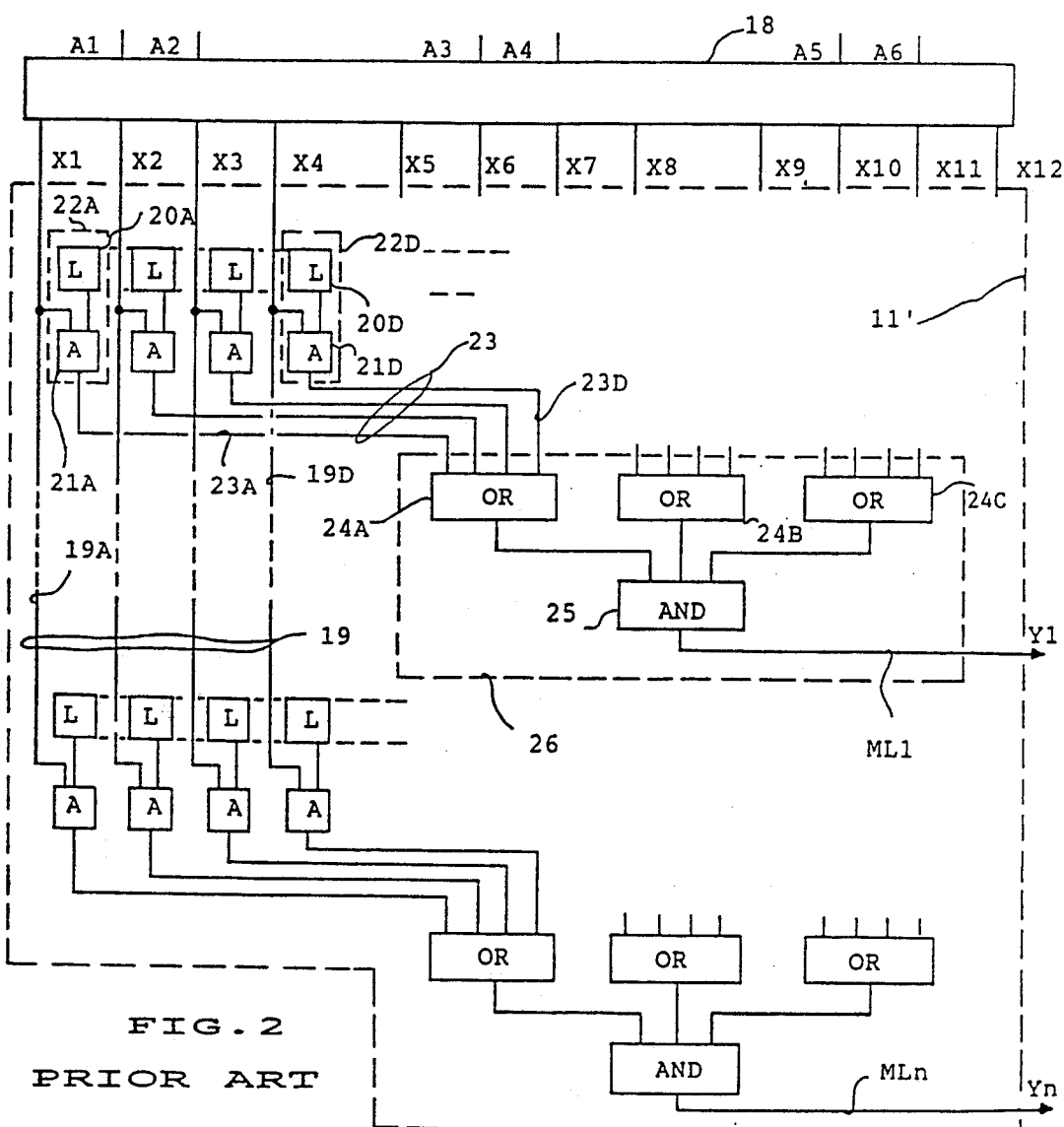
FIG. 2 is a schematic implementation of a portion of a reconfigurable AND array of the prior art including an electronic logic fuse at each input line output line intersection, each comprising a storage element such as a latch and 4 device NAND gate.
Figure 4:
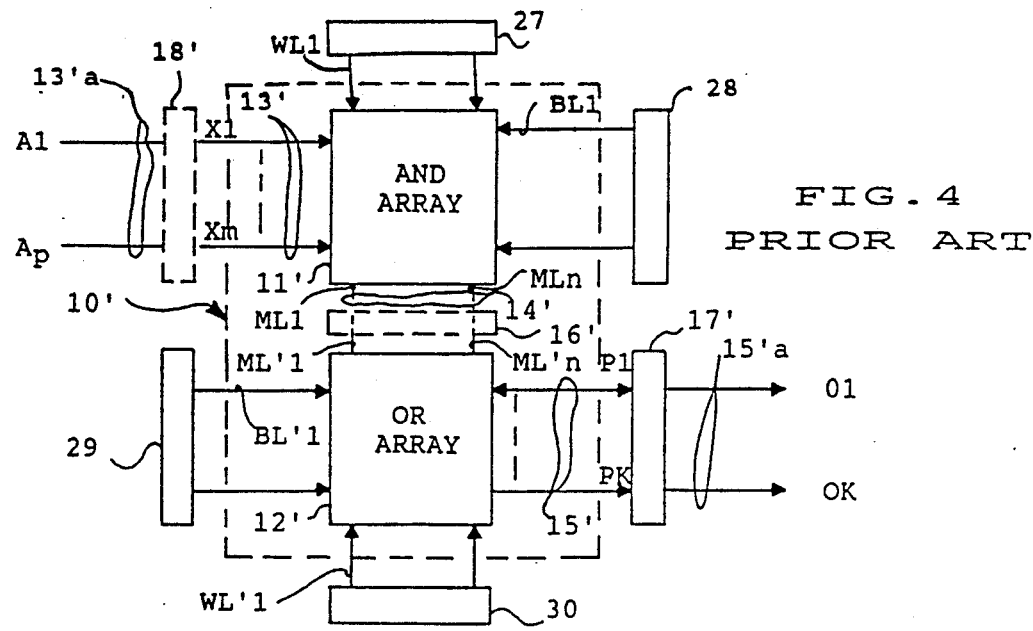
FIG. 4 is a schematic diagram of a "variable" content PLA of the prior art when provided with decode and write logic circuitry to allow software reconfiguration by the user.
Figure 3:
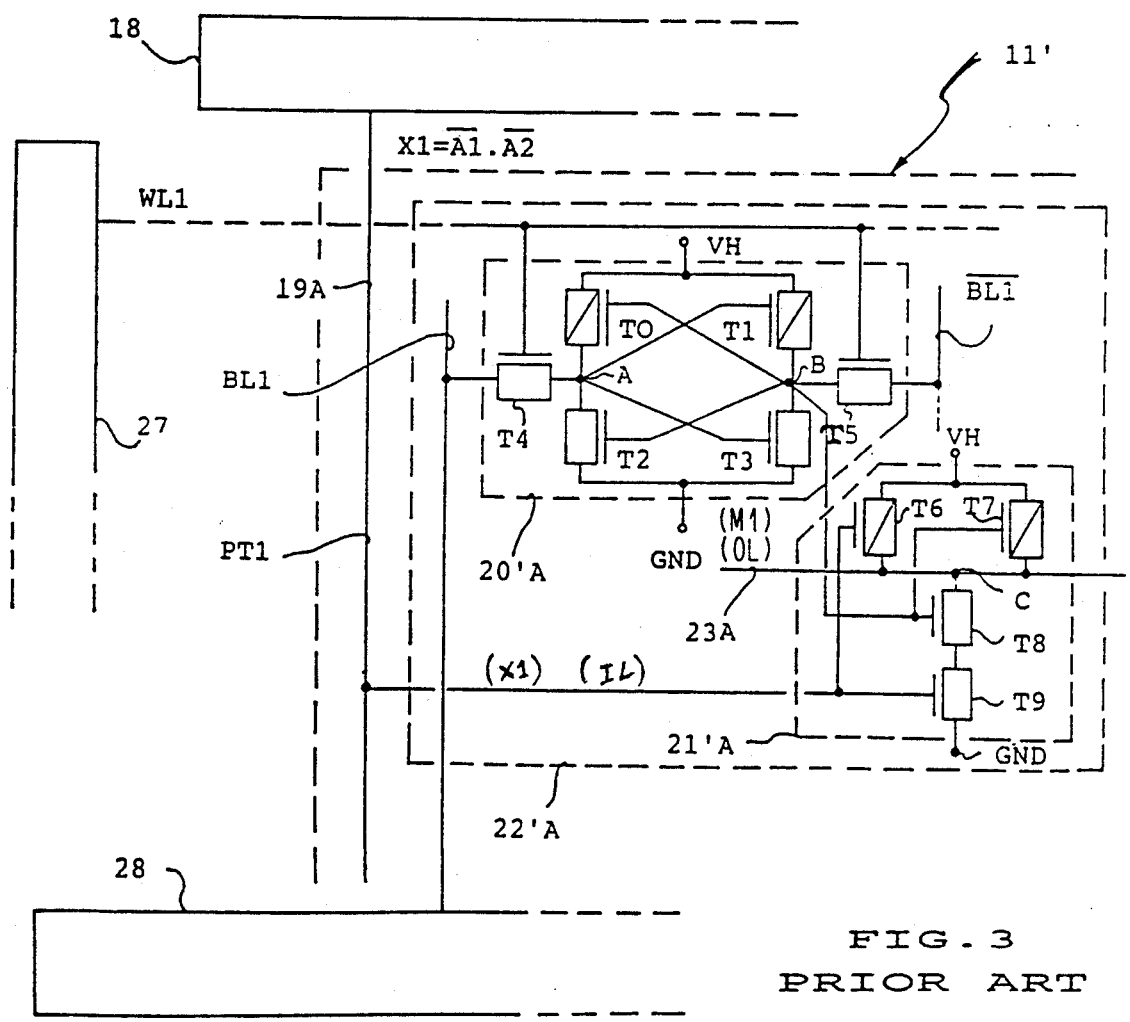
FIG. 3 gives details of a portion of the reconfigurable AND array of FIG. 2 when said electronic logic fuse is implemented with a standard 6 device SRAM cell and 4 device NAND gate, in MOSFET technology.

Thus, any "MISMATCH" occurring along a given match line ML will cause its deselection (OR function of the MISMATCHES, which, according to the De Morgan's rule, is equivalent to the AND function of MATCHES). Only the Match Lines remaining at their initially precharged positive voltage will be considered selected. Logic block 26 of FIG. 3 is therefore no longer necessary.

In the particular embodiment of FIG. 7 the Match Lines, e.g. ML1 are connected to the OR array through a series of circuits 34.1 to 34.n which essentially consist of a sense amplifier and a latch. All the n sense circuits 34.1 to 34.n on the Match Lines ML1 to MLn are included in a Match Line Sense Amplifier/Latch block referenced 34. MLSA block 34 is an essential part of the RPLA in storing the state of the Match Lines at the end of the AND array operation. This allows the Match Lines to be precharged again to their initial positive voltage during the subsequent OR array operation, this is a key feature in achieving high performance RPLA implementation.

Depending on the specific OR array embodiment the block 34 outputs can propagate to the OR array the true or the complemented state of any Match Lines. In the specific embodiment of FIG. 7 a positive voltage is propagated to the OR array on the outputs corresponding to "selected" AND array match lines ML.

However, in some particular applications, e.g. if the AND array is made of NFETs and the OR array is made of PFETs (or vice versa), the MLSA block 34 may no longer be necessary, because neither complementation nor amplification is needed. In this case, the RPLA circuit operates like a combinatorial logic circuit.

The OR array 33 is of similar construction. RLF'11 is also comprised of six FETs: T10' to T15'. In RLF'11, the drain electrode of NFET T15' is connected to an OR out line OR1 while its gate electrode is connected to the Match Out Line ML'1 (the digital signal of ML1 after amplification and complementation in sense amplifier 34.1). The OR array output signals P1 to Pk are also amplified and latched under clock control. OR array output signals P1 to Pk are fed to corresponding circuits referenced 38.1 to 38.k which have different functions but each essentially consists of a sense amplifier and a latch. The resulting output signals are referenced O1 to Ok. All said circuits 38.1 to 38.k are included in an Output Sense Amplifier/Latch block 38. The OR array is also provided with word line decoder and bit line write driver blocks respectively referenced 39 and 40. RPLA circuit OUT signals O1 to Ok are available on circuit OUT line bundle 38a at the output of block 38.

The Match Out Lines referenced ML'1 to ML'n are also referenced OR input lines, which carry the OR input signals (OR in 1, ... OR in n). The OR input lines referenced OR1 to ORk carry the OR output signals P1 to Pk also referenced (OR out 1, ..., OR out n).

The OR array operation will now be given, still with respect to FIG. 7. In the special embodiment of FIG. 7 a NFET transfer gate is used to connect the OR array cells SE to the OR lines OR1 to ORk. The OR lines are initially precharged to a positive voltage during the AND array operation. The OR array cells SE are said to store a logical "1" when their node B (connected to the source electrode of transmission gate T15') is at ground voltage, ("negative logic" convention while "positive logic" is used in the AND array). The Match Out Lines, such as ML'1, driven by block 34 outputs, are at a positive voltage when a MATCH occurred in the AND array on the corresponding Match Line, e.g. ML1. The transfer gate T15' will conduct when its gate electrode (connected to the match out line) is positive with respect to its source electrode (connected to node B of cell SE). This occurs when the cell stores a logical "1" (node B at 0 volts) and the match out line ML' is in the selected state (positive voltage). The transfer gate T15' conduction will cause the OR line voltage to be discharged from its precharged positive voltage to ground through T15', node B and T13' of cell SE'. This is true for the conduction of any of the cells connected and the OR line thus takes a "1" state if at least one SE cell had a "1" stored in it to the OR line (OR function of logical "1s," negative logic being used in OR array).

It is essential to the correct understanding of the present invention to notice that in the AND array, for any reprogrammable logic fuse, e.g. RLF11, the input lines and the output lines are respectively the product term lines, e.g. PT1 and the Match Lines, e.g. ML1. Similarly in the OR array, for any reprogrammable logic fuse, e.g. RLF'11, the input lines and the output lines are respectively the Match Out Lines, e.g. ML'1 and the OR output lines, e.g. OR1.

Still with the particular implementation of FIG. 7, perfect isolation between cells may imply additional constraints in order to prevent undesired communication between cells, e.g. RLF11 and RLFlm dotted to the same output line, e.g. ML1. Let us assume, potential at node B11 is OV while potential at node Blm is VH. If PT1 is raised high (to VH), the potential of the Match Line ML1 tends toward OV; if, simultaneously product term line PTm is raised high, transistor T15m is made conductive, and a logic "0" will be written over the logic "1" stored in the storage element SElm, which is not acceptable. The potential of said output line must be above the potential of the input line (e.g. PT1, in the AND array) minus the threshold voltage Vt of FETs.

In summary, there is no communication between cells when the following requirements are satisfied in both AND and OR arrays: the high level (logic 1) of the input line is defined at VH-Vt. Same reasoning applies along the Match Line and Match Out Line between AND or OR array. So that the potential of the Match Line must remain lower than VH-2Vt. In other words, VH-Vt will be the logic "1" and VH-2Vt will be the logic "0." The low level (logic 0) of the output line is clamped at Vh-2Vt. As a result, using reduced voltage swing instead of full swings (0-VH), improves the performance of the RPLA's, in terms of access time and power consumptions, but requires the use of sense amplifiers in blocks 34 and 38 to amplify very small analog voltage swings on precharged lines to detect the MATCH/MISMATCH state.

The usage of FETs having different threshold voltages, so called low Vt and high Vt FETs, is an alternate solution to avoid these constraints. However, this solution has other inconveniences, in requiring a fairly more complex manufacturing process.

The most important control signal which are necessary for a proper operation of the RPLA circuit 31 of FIG. 7 are also represented. For example, the Set Product Term signal SPT controls generation of product terms in block 35. Word decoder 36 is controlled by signals ADD and SWD which respectively stand for ADDRESS and Set Word Decoder. Bit line driver 37 is under control of DI (for Data In) and WR (write) signals. At last, the Match Line Sense Amplifier/Latch block 34 is controlled by SSA (Set Sense Amplifier), R (Restore) and G (tristate clock). The role of these signals and control clocks will be explained later. Similar construction applies to additional logic circuitry of the OR array.

FIG. 7 gives also an overall view of what could be the topography of a silicon chip having a RPLA embedded therein. A1 to Ap are the IN signals to be applied to the chip while O1 to Ok are the OUT signals to be processed externally.

Figure 8:
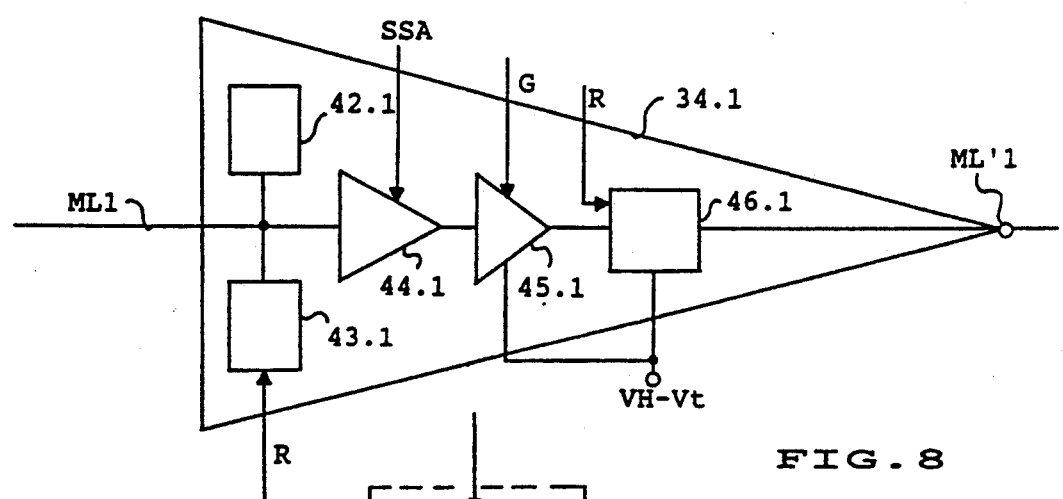
FIG. 8 shows details of one of the sense amplifiers which are used whenever necessary in the RPLA circuit of FIG. 7.

FIG. 8 represents a circuit, e.g. 34.1 of the Match Line Sense Amplifier/Latch block 34. It includes both a clamp circuit 42.1 to hold the Match Line ML1 to the VH-2VT potential as explained above and a restore circuit 43.1 to restore ML1 to the potential of VH after sensing. A single ended sense amplifier 44.1 amplifies the digital signal (AND out signal) available on ML1. The amplified signal is then applied to a standard tristate driver circuit 45.1 for isolation purposes when the ML1 is restored to VH. The tristate driver circuit 45.1 is under control of a control clock signal G. However, this tristate circuit is optional, depending on the specific implementation. It may become superfluous, in particular if the AND array is implemented with NFETs and the OR array with PFETs or vice versa. It is admittedly known that the size of PFETs is larger than the size of N FETs. The output signal is applied to a register 46.1 to latch the signal with appropriate polarity on the Match Out Line ML'1. With the particular implementation of FIG. 7 with complementary P and N devices, it is important to understand that the digital signal latched in latch 46.1 has the opposite polarity of the input signal applied to Match Line ML1.

To ensure that the Match Out Lines, e.g. ML'1 are clamped to the VH-Vt potential, latch 46.1 and tristate driver circuit 45.1 are biased to a power supply of that value.

Circuits of the Output Sense Amplifier/Latch block 38 are of similar construction except in that: 1) the tristate driver is no longer necessary, and 2) the output latch is preferably provided with true/complement outputs.

Figure 9:
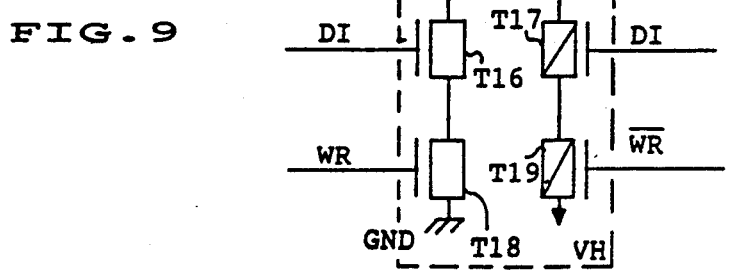
FIG. 9 shows details of one of the bit line write driver circuits which are used in the RPLA circuit of FIG. 7.

FIG. 9 represents an elementary circuit, e.g. 37.1 of the bit line write driver block 37. The circuit is comprised of four FETs T16 to T19 mounted in series between VH and GND. NFET T16 and P FET T17 have their gate electrodes connected to DI signal (Data In), NFET T18 has its gate electrode connected to WR signal (WR stands for Write) and at last PFET T19 has its gate electrode connected to the complementary signal $\overline{WR}$.

When appropriately selected by the WR clock signal, the digital data is inverted by the inverting structure composed of FETs T16 and T17 and appears on BL1; assuming that Word Line WL1 is selected, the inverted digital data is transferred to the storage element SE 11 and latched therein.

Word Line decode circuit blocks 36 and 39 are not detailed here for sake of simplicity because they are well known circuits for the logic circuit designer. However, it must be said that each output driver, e.g. 35.1, which drives a product term line e.g. PT1, is biased at a power supply having the VH=Vt value, for the purpose explained above.

It is recalled that the design of RPLA 31 depicted in FIG. 7 is of the clocked type. This means that all the signals are activated after a clock pulse and restored as soon as the function is done. This clocking system improves the access and the power consumption of the whole circuit. Operation of RPLA 31 will now be explained by reference to FIGS. 10 and 11 which are respectively related in the AND and OR arrays. In the AND array 32, following the rising edge of the main clock (curve 47), a single shot pulse (not shown) is generated with a calibrated width. This pulse referred to as the SPT signal enables the product term generator 35 to deliver a pulse on one product term PT, e.g., PT1 as explained above. When the potential of this decoded PT line PT1 goes high (curve 48), the FETs which are connected to this PT line, e.g. T15, turn on if their left (source) electrode is at 0 volt. Depending on the control data stored in the storage elements, e.g. SE11, the match occurs or not. In case of mis-match, the Match Line, e.g. ML1, which was precharged at the high level (VH) is pulled down to VH-2VT because the high level of the Match Line is clamped at VH-2VT in order to prevent communication between two RLF's as explained above. This is apparent from curve 49. The sense amplifier, e.g. 44.1 is then settled when enough swing in the Match Line appears. Curve 50 shows the SSA signal. Potential at the output of the sense amplifier is shown by curve 51. The tri-state driver circuit (45.1, FIG. 7) is controlled by clock G or strobe curve (52), to allow to isolate ML1 and storage element SE11 when the matching is stored. As soon as tristate driver circuit is turned off, the signal on the Match Out Line ML'1 (curve 53) is presented to the OR array for sensing. ML1 is then restored at the initial level (the restore signal is represented by curve 54). Simultaneously, an identical operation is performed in the OR array 33 to realize the OR function. Operation will then be described with the reference to FIG. 11.

Figure 11:
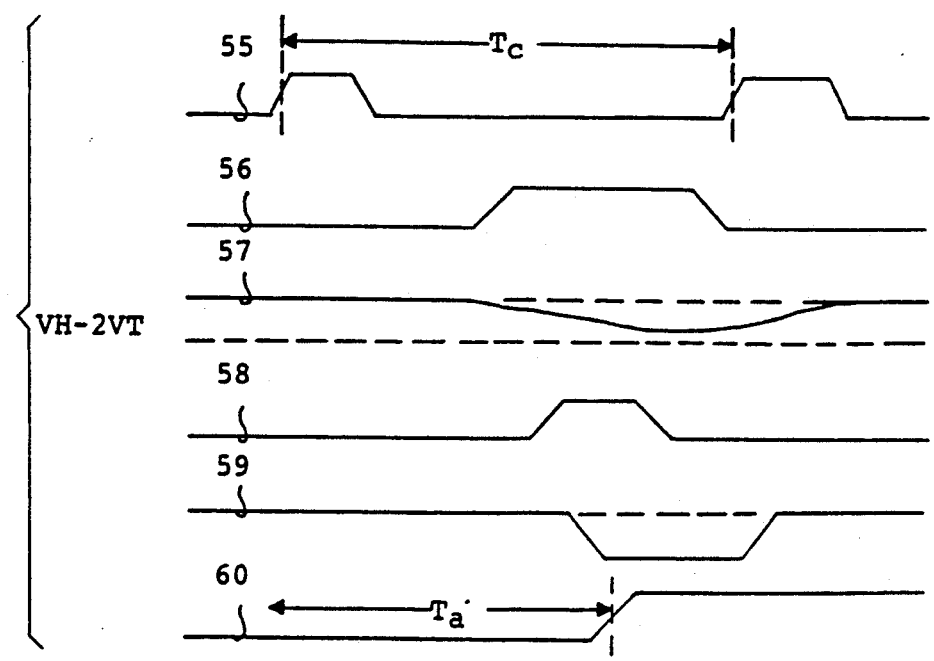

Curves 55 and 56 (identical to curve 53) represent the main clock signal and the signal on the Match Out Lines respectively as it may be understood from FIG. 11. The OR array output signal appears on a OR array output line and is shown by curve 57. The corresponding sense amplifier in block 38 is then set (curve 58) and its output signal, say the OR array output signal, is shown by curve 59. Once latched, the OR OUT signal is given by curve 60.

Figure 10:
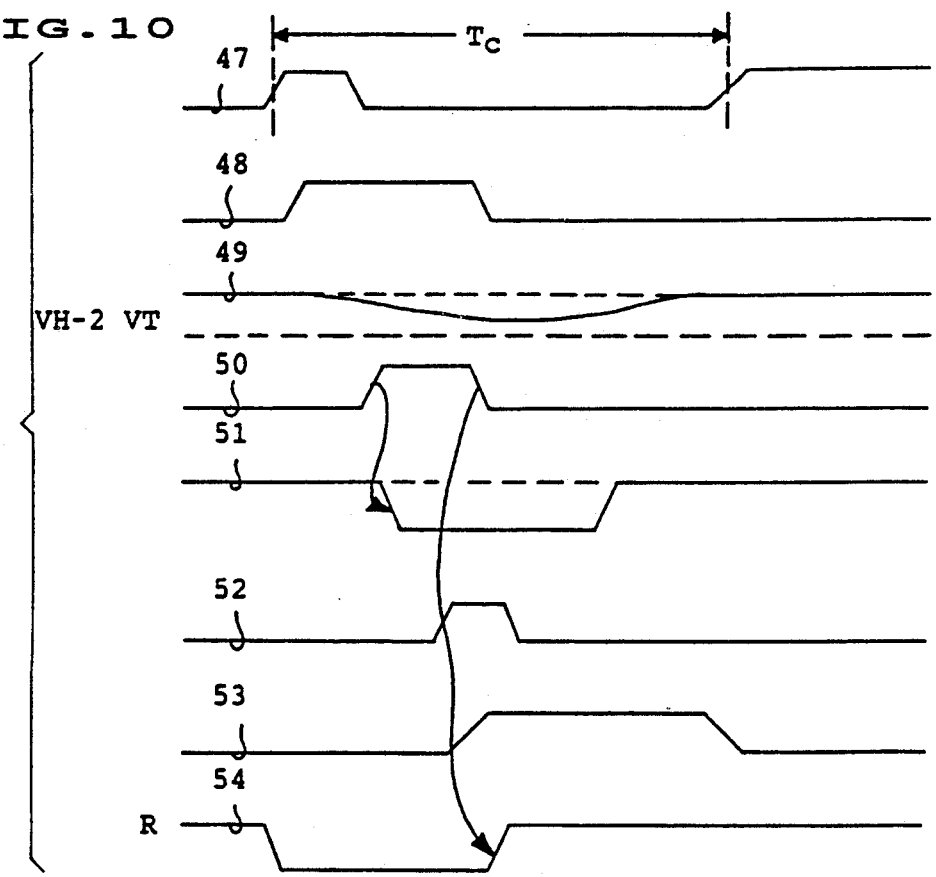
FIGS. 10 and 11 show respectively timing diagrams of the AND and OR arrays of the RPLA circuit of FIG.

FIG. 10 shows in particular, both the cycle time Tc and the access time Ta which are important data specifications for the RPLA circuit of FIG. 7.

It is a key advantage of the RLF of the present invention to be fully compatible with standard SRAM's in terms of power supplies and voltage swings. As a result, the RPLA of the present invention is really a "RAM PLA." It gives the user a definitive capability to generate growable Reloadable PLAs, with the following advantages:
   it is easy to do soft personalization of some parts of a logic design;
   it minimizes the engineering changes burden during the design phase, and it further allows;
   to implement EC's on the system in the field.

An excellent typical application would be in a communication controller system or in a modem which could be used in different CCITT requirements environment which requires different protocols (start/stop, SDLC, BSC, ...). The present invention permits having only one RPLA chip which can be loaded during the boosting of the system with the microcode corresponding to the appropriate protocol of a determined application, instead of requiring several ROM chips each having a specific protocol stored therein, one among them being selected depending upon the application.

Another application would be in a table look up when variable answers are necessary.

While the present invention has been described with respect to a specific embodiment, it is not so limited. Numerous modifications, changes and improvements will occur within the spirit and scope of the invention.

We claim:

1. A Reloadable Logic Array or RLA comprising:
   a plurality of electrically isolated word lines carrying word signals;
   a plurality of electrically isolated bit lines carrying bit signals;
   said word and bit lines together forming a first matrix of non-conductive intersections;
   a plurality of input lines carrying digital input signals;
   a plurality of output lines carrying output signals;
   said input and output lines together forming a second matrix of non-conductive intersections;
   a plurality of reprogrammable logic fuses disposed at each couple of said first and second matrixes of non-conductive intersections, at least one of said reprogrammable logic fuses including:
   a static RAM cell biased between first and second voltages and provided with first and second common nodes to store data therein;
   a first FET device having a first source electrode connected to one said bit line, a first drain electrode connected to said first common node, and a first gate electrode connected tot he corresponding said word line; and
   a second FET device having a second source electrode connected to said second common node, a second drain electrode connected to said input line, and a second gate electrode connected to said output line.

2. A Reloadable Programmable Logic Array or RPLA comprising:
   a) a logic AND array including:
   a plurality of first electrically isolated word lines carrying first word signals;
   a plurality of first electrically isolated bit lines carrying first bit signals;
   said first word and bit lines together forming a first matrix of non-conductive intersections;
   a plurality of first input lines carrying first digital input signals;
   a plurality of first output lines carrying first output signals;
   said first input and output lines together forming a second matrix of non-conductive intersections;
   b) a logic OR array including;
   a plurality of second electrically isolated word lines carrying second word signals;
   a plurality of second electrically isolated bit lines carrying second bit signals;
   said second word and bit lines together forming a third matrix of non-conductive intersections;
   a plurality of second input lines carrying second digital input signals;

a plurality of second output lines carrying output signals;

said second input and output lines together forming a fourth matrix of non-conductive intersections;

c) a plurality of reprogrammable logic fuses disposed at each respective couple of said first and second and said third and fourth intersections, at least one of said reprogrammable logic fuses in the AND array and in the OR array comprising:

a static RAM cell biased between first and second voltages having first and second common nodes to store control data therein;

a first FET device having a first source electrode connected to one said bit line, a first drain electrode connected to said first common node, and a first gate electrode connected to the corresponding said word line; and a second FET device having a second electrode connected to said second common node, a third electrode connected to said input line, and a fourth electrode connected to said output line.

3. The RPLA of claim 2 wherein each of said static RAM cells is comprised of four FETs.

4. The RPLA of claim 3 wherein all said FET devices forming the RLFs of said AND array are of a first type of conductivity and all said FET devices of said OR array are of a second type of conductivity.

5. The RPLA of claim 2 wherein each of said static RAM cells is comprised of two cross-coupled FETs of different types of conductivity pairs.

6. The RPLA of claim 5 and further including sense amplifier/latch means for making said second input signals have an opposite polarity to said first output signals.

7. The RPLA of claim 6 and further comprising clamping means for clamping: a) said first and second input lines to the high power supply voltage minus the threshold voltage of said FET devices; and b) said first and second output lines to the high power supply voltage minus twice the threshold voltage of said FET devices.

8. The RPLA of claim 7 further comprising output sense amplifier/latch means for amplifying and latching said second output signals before use.

9. The RPLA of claim 8 wherein said sense amplifier/latch means and output sense amplifier latch means are of the clocked type.

10. The RPLA of claim 2, wherein said second input signals are derived from said first output signals.

* * * * *